United States Patent

Wanlass

[11] Patent Number: 5,891,763
[45] Date of Patent: Apr. 6, 1999

[54] DAMASCENE PATTERING OF SOI MOS TRANSISTORS

[76] Inventor: Frank M. Wanlass, 540 Dawn Dr., Sunnyvale, Calif. 94087

[21] Appl. No.: 955,887

[22] Filed: Oct. 22, 1997

[51] Int. Cl.$^6$ .................................................. H01L 21/00
[52] U.S. Cl. ........................ 438/149; 438/151; 438/412; 438/430; 438/164; 438/589
[58] Field of Search ..................................... 438/149, 151, 438/412, 430, 164, 589

[56] References Cited

U.S. PATENT DOCUMENTS

| | | | |
|---|---|---|---|
| 4,675,984 | 6/1987 | Hsu ............................................ | 438/637 |
| 4,758,531 | 7/1988 | Beyer et al. ............................. | 438/430 |
| 4,835,585 | 5/1989 | Panousis ................................ | 357/23.4 |
| 4,876,217 | 10/1989 | Zdebel ...................................... | 438/430 |
| 5,011,783 | 4/1991 | Ogawa et al. ........................... | 438/149 |
| 5,093,273 | 3/1992 | Okumura ................................ | 438/589 |
| 5,185,280 | 2/1993 | Houston et al. ......................... | 438/164 |
| 5,597,739 | 1/1997 | Sumi et al. .............................. | 438/164 |
| 5,780,340 | 7/1998 | Gardner et al. ......................... | 438/430 |
| 5,814,537 | 9/1998 | Maa et al. ................................ | 438/151 |
| 5,843,827 | 12/1998 | Gregor et al. ........................... | 438/589 |

Primary Examiner—John F. Niebling
Assistant Examiner—Lynne A. Gurley

[57] ABSTRACT

The present invention is a technique for producing planar silicon on insulator MOS transistors, where the channel regions are created in an underlying single crystal silicon wafer, and where the source-drain extension regions are created by damascene patterning a thin film of amorphous silicon deposited on a layer of oxide deposited on the silicon wafer.

6 Claims, 5 Drawing Sheets

DAMASCENE PATTERING OF SOI MOS TRANSISTORS

BACKGROUND OF THE PRESENT INVENTION

1. Field of the Present Invention

The present invention relates to a technique for producing planar silicon on insulator MOS transistors, where the channel regions are created in an underlying single crystal silicon wafer, and where the source-drain extension regions are created by damascene patterning a thin film of amorphous silicon deposited on a layer of oxide deposited on the silicon wafer.

2. Description of the Prior Art

The primary advantage of using silicon on insulator (SOI) substrates, rather than using bulk silicon, for forming MOS transistors has long been recognized as being that of reduced stray capacitance. This allows, of course, higher operating frequencies to be obtained. SOI has other advantages such as better packing density, borderless contacts, latch-up freedom, and radiation hardness.

A thin film of crystalline silicon epitaxially deposited on a polished single crystal aluminum oxide substrate (SOS) was the first composite material to be used for SOI. However, since the crystal properties of aluminum oxide do not perfectly match those of silicon there has always been the problem of reduced yield due to defects in the silicon film.

In recent years SOI circuits have been made by forming a thin film of crystalline silicon on silicon dioxide, where the oxide has been grown on a silicon support wafer. This has enabled the production of silicon films with much lower defect densities, because the support wafer physical properties, such as thermal expansion coefficient, match those of the silicon film. Currently SOI refers to silicon on oxide, which will be our convention.

There are a few different methods for producing SOI substrates, such as wafer bonding or high current oxygen implantation. All of these methods are rather difficult because the silicon film has to be single crystal, and for best performance of the finished circuit, the film should be very thin (less than approximately 1000 Angstroms).

Another difficulty with current SOI is that the MOS transistor body connections are typically left floating for efficiency of chip layout. This can sometimes cause problems. For example, excess charge can remain in a transistor floating body region when attempting to turn a transistor off, which can slow down circuit operation. This problem can be solved by implanting just the right amount of recombination centers in the film; however, this is difficult to control, because too many centers will degrade the mobility of the film.

It is therefore the object of the present invention to provide a simplified method for producing SOI substrates; and to provide a technique for electrically connecting MOS body regions to well defined voltages without incurring any layout area penalty; and to maintain the high density layout capability of current SOI.

SUMMARY OF THE PRESENT INVENTION

The present invention is a technique for damascene patterning of silicon on insulator MOS transistors in a thin film of amorphous silicon deposited on a layer of oxide grown on a silicon wafer, where the oxide has previously been partially etched with a pattern of trenches, and where the amorphous silicon is chemically mechanically removed everywhere but in these trenches. In addition, the invention provides for the amorphous layer to contact the underlying silicon substrate through multiple small oxide openings, where subsequent transistor channel regions, aligned to these openings, will be formed in the underlying single crystal silicon wafer.

IN THE DRAWINGS

DETAILED DESCRIPTION OF THE INVENTION

The following is a description of a preferred process flow for making the SOI substrates of this invention, where the thicknesses shown are representative of the requirements for a low voltage CMOS logic circuit. Other thicknesses can used for different applications.

Figure 1:
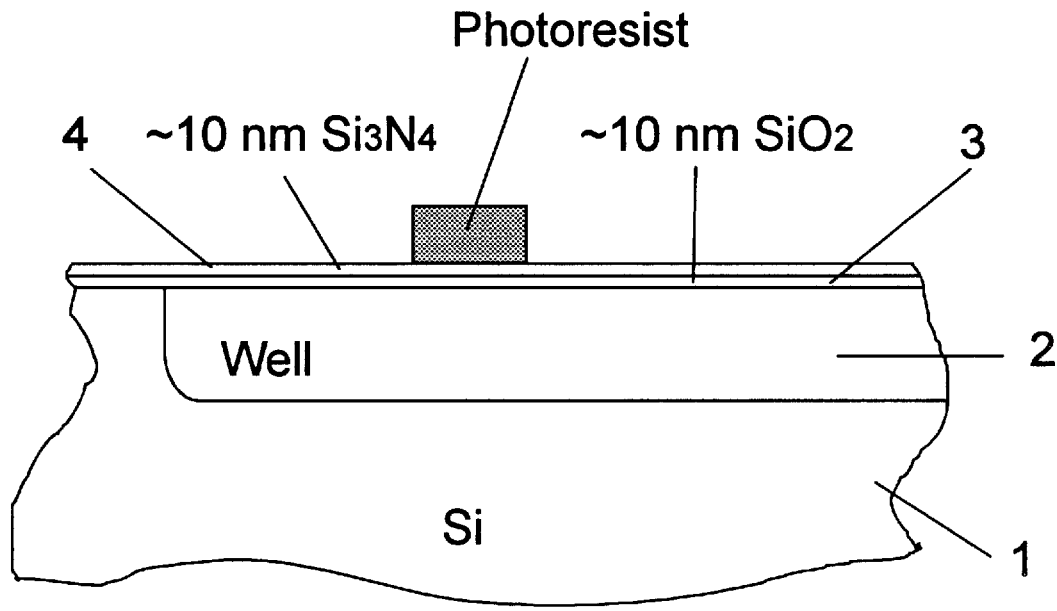
FIG. 1 is a cross section of a portion of a wafer at the beginning of this invention, where wells have been previously formed, where $SiO_2$ and $Si_3N_4$ have been grown, and where photoresist has been patterned.

1. FIG. 1 shows, at the start of the process, a portion of a single crystal silicon wafer 1 that has a grown $SiO_2$ layer 3 with a thickness of ~10 nm, a deposited $Si_3N_4$ layer 4 with a thickness of ~10 nm and shows patterned photoresist that will define the location of MOS channel regions. Also a previously implanted and diffused well region 2 is shown.

Figure 2:
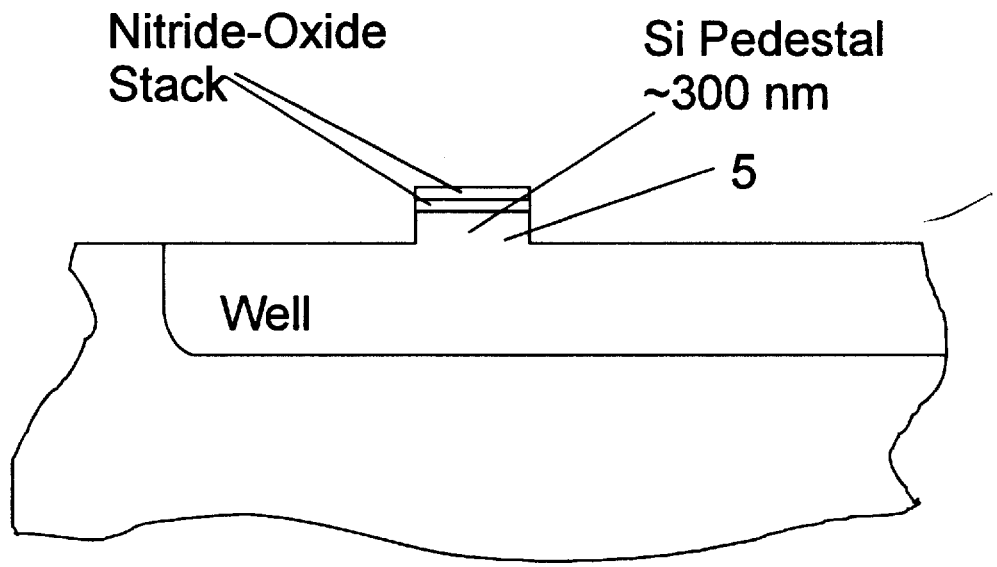
FIG. 2 shows a wafer after etching $Si_3N_4$, $SiO_2$, and Si.

2. With the resist in place the wafer is etched to remove the thin $Si_3N_4$, the thin $SiO_2$, and finally plasma etched to remove ~300 nm of silicon. After resist removal silicon pedestals 5 will remain capped with thin oxide and nitride, as shown in FIG. 2 These silicon pedestals will be ~300 nm high, and there will be one positioned for every MOS channel region in a subsequent logic circuit. To provide for alignment tolerance, the lateral length and width of each pedestal will be slightly larger than the subsequent MOS channel region to which the pedestal aligns.

Figure 3:
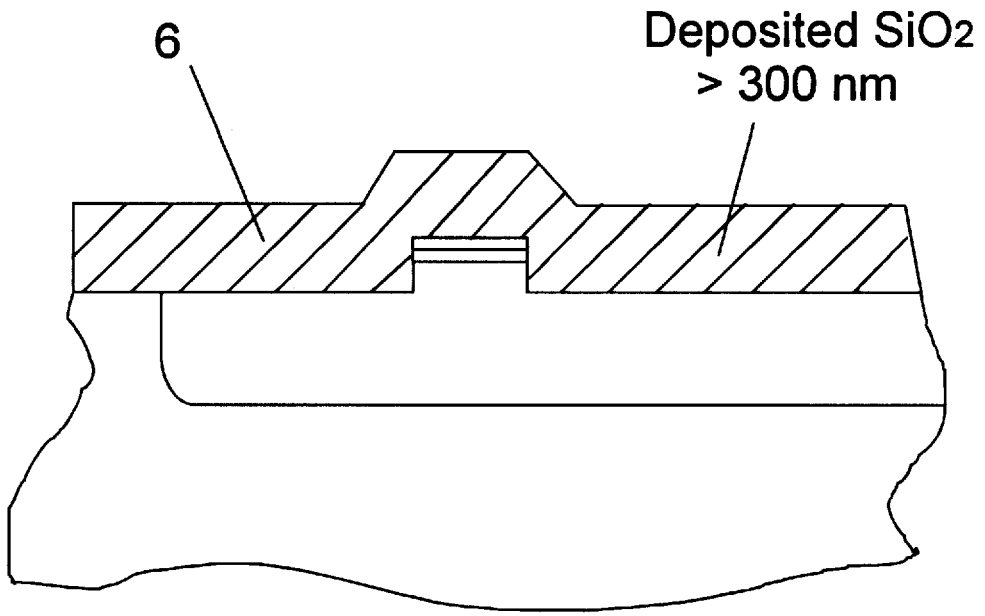
FIG. 3 shows a wafer after deposition of $SiO_2$.

3. After a good cleaning silicon dioxide 6 is deposited by well known techniques to a thickness greater than 300 nm. The results of this are shown in FIG. 3. As is well known, for the best quality the $SiO_2$ should be steam densified.

Figure 4:
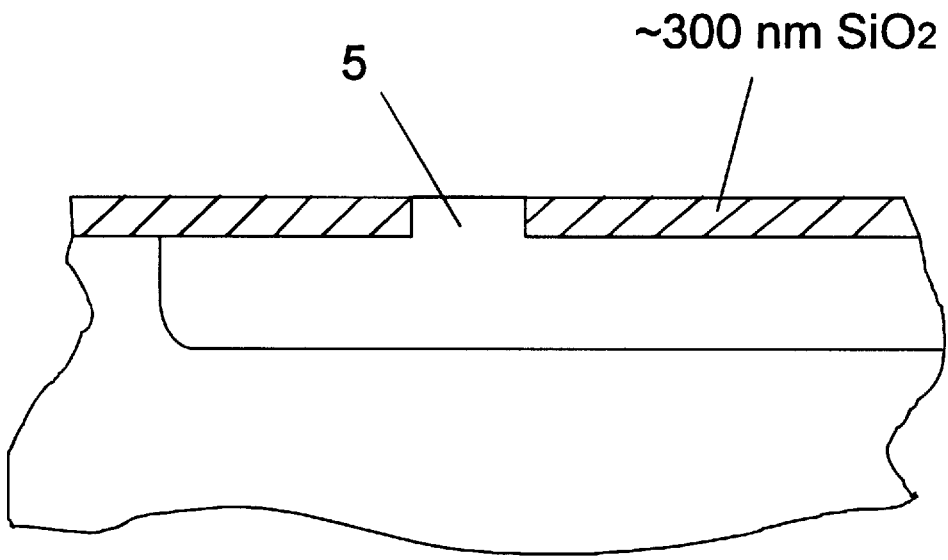
FIG. 4 shows a wafer after chemical mechanical polishing of $SiO_2$, and after removal of the thin $Si_3N_4$ and $SiO_2$.

4. Next chemical mechanical polishing is performed on the $SiO_2$ using the $Si_3N_4$ at the tops of the pedestals as etch stops. Next the thin oxide and nitride layers at the tops of the pedestals are removed, and finally a final smoothing chemical mechanical polishing is performed, with the pedestal silicon 5 as an etch stop. FIG. 4 shows the results of these steps, where the top of the deposited oxide is essentially coplanar with the tops of the pedestals, both being ~300 nm high.

Figure 5A:
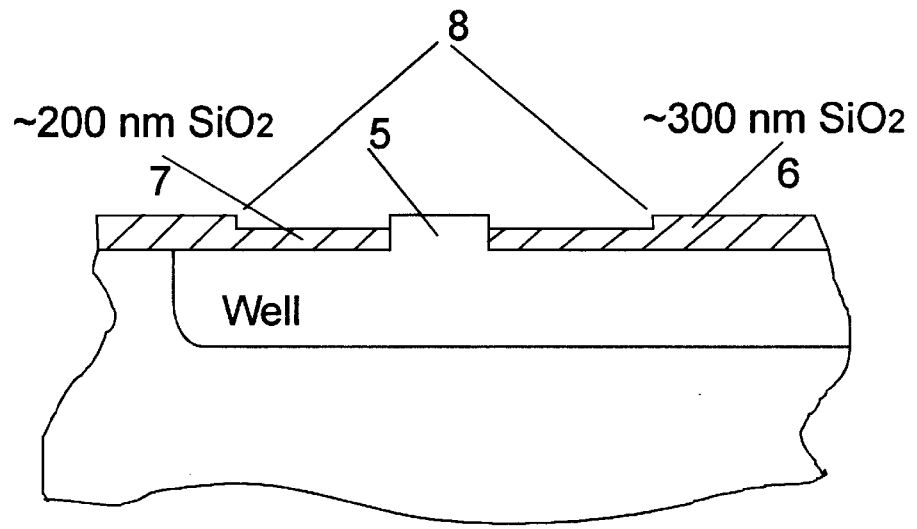
FIG. 5A shows a wafer after etching $SiO_2$.
Figure 5B:
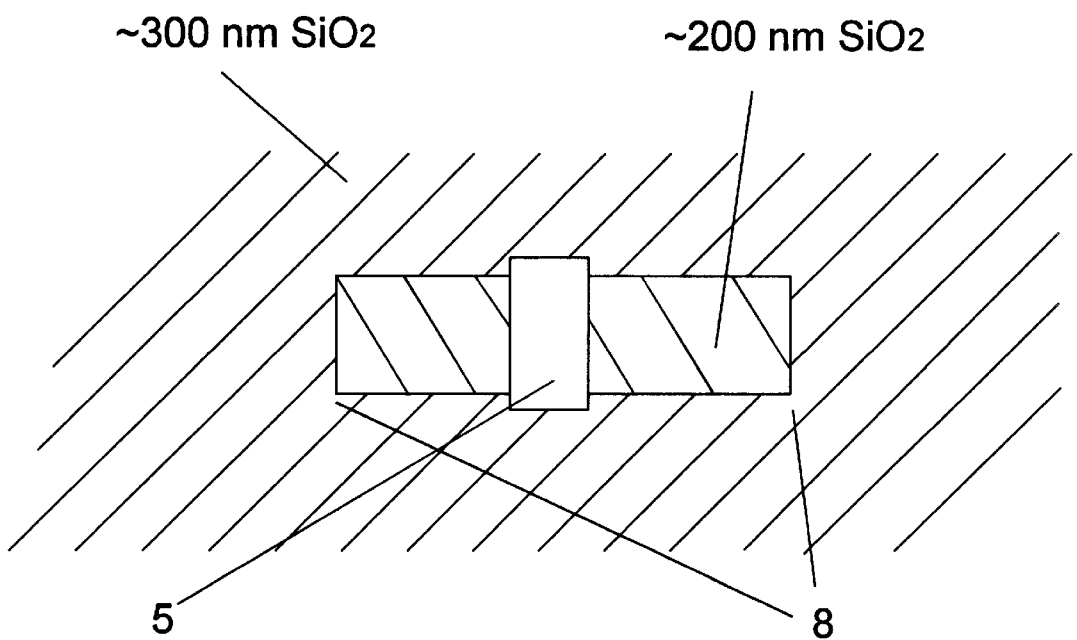
FIG. 5B shows a plan view after etching $SiO_2$.

5. Next photoresist is patterned with openings 8 to define a complete MOS transistor, having source, drain and channel regions. Through these openings the deposited oxide is partially etched to a depth of ~100 nm, using either a wet etch or plasma etch that etches oxide much faster than silicon. FIG. 5A shows the results of this after photoresist removal, where ~300 nm of oxide 6 is left in what will become the field regions between MOS transistors, and ~200 nm of oxide 7 is in the regions that will be beneath the source and drain extensions. FIG. 5B is a planar view of the same.

Figure 6:
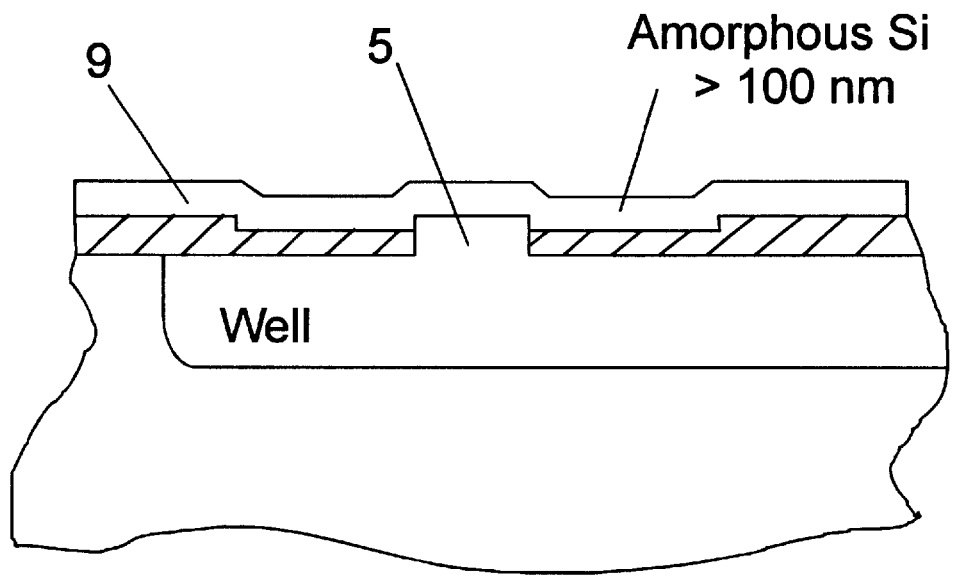
FIG. 6 shows a wafer after deposition of amorphous Si.

6. After a good cleaning, amorphous silicon 9 is deposited to a thickness >100 nm, which is shown in FIG. 6. In the same reactor hydrogen should be flowed over the wafers just prior to silicon deposition to remove any residual oxide that might remain on the tops or sides of the pedestals, thereby, assuring intimate contact between the pedestals and the deposited silicon.

Figure 7:
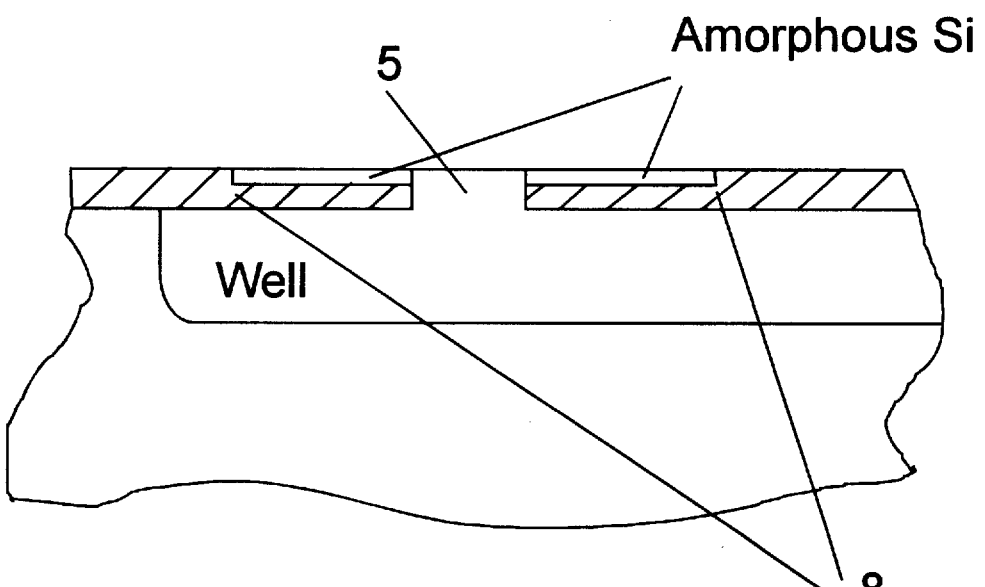
FIG. 7 shows a wafer after chemical mechanical polish of the amorphous Si.

7. The wafer is then chemical mechanically polished using the ~300 nm field oxide as an etch stop, followed, if necessary, by a short polishing chemical mechanical etch to assure the top surface of the single crystal pedestals 5 are exposed. FIG. 7 shows the results of this polishing.

Figure 8:
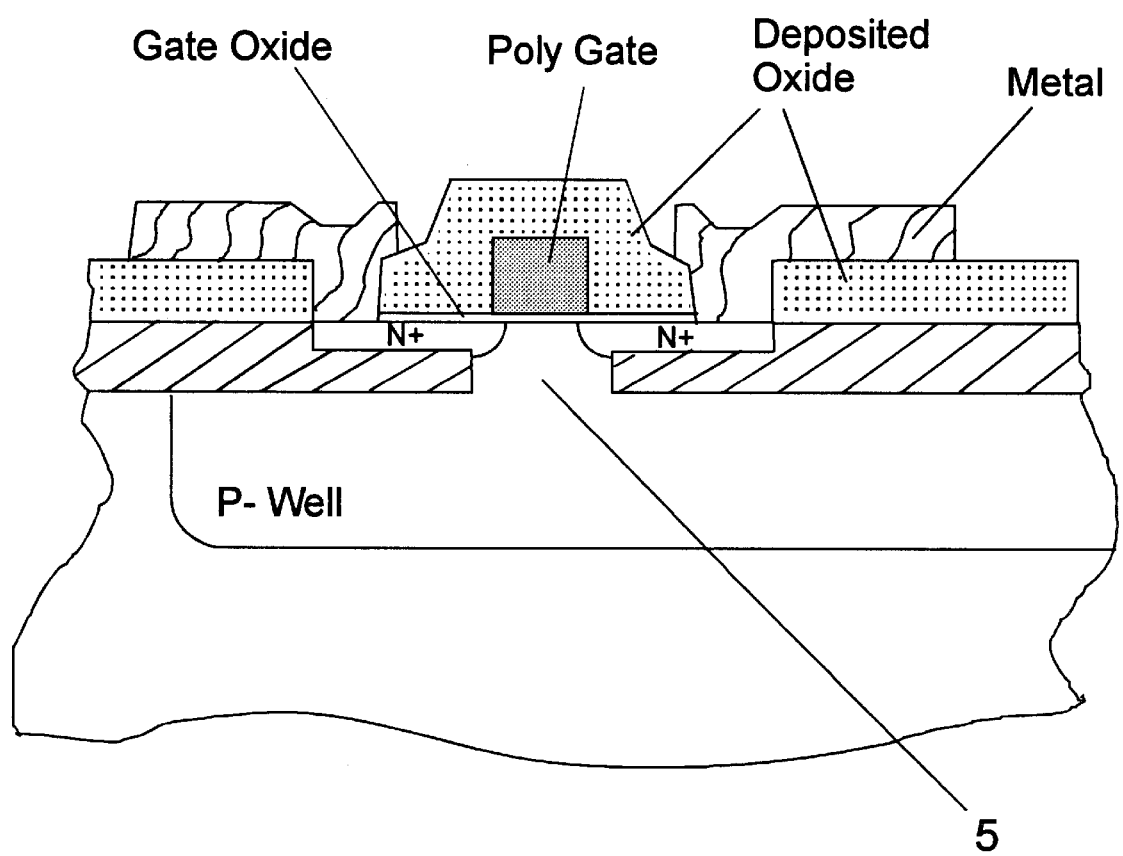
FIG. 8 shows a cross section of an NMOS transistor, that uses this invention's starting material.

Subsequent processing can proceed using well known procedures. FIG. 8 shows the cross section of a completed silicon gate NMOS transistor that uses this invention's starting material. More complex transistors are possible, such as transistors with silicided gates or silicided source drain regions The pedestal regions 5 are somewhat wider and longer than the transistor channel region. This is to insure, that even with some small misalignment, the transistor regions directly under the Poly gates will be directly over the silicon substrate.

All the Figures are not quite drawn to scale laterally; pedestals 5 typically will be less than ⅙ of the transistor areas defined by openings 8, resulting in most of the transistor area positioned over oxide rather than over silicon. This will reduce the capacitance of the source and drain junctions, and will allow source and drain contact openings to aluminum to be made with zero misalignment tolerance.

The process flow as described results in field regions between transistors having a thickness of 300 nm. Field regions of this thickness can have a very high field inversion voltage if the previously implanted and diffused wells have a diffusion profile that results in dopings of ~$10^{18}$ ions/cm$^3$ approximately 300 nm below the original silicon wafer surface, because this depth becomes the final wafer oxide interface. High well doping levels will also prevent bulk punch through either from source to drain or between neighboring devices. Such a high well doping is not possible with older non SOI processes because source and drain junction capacitance would be prohibitive.

Even with high well doping levels between transistors, the doping level at the tops of pedestals, which are MOS channel regions, can be adjusted to be lower by adjusting the well implant profiles into the original wafers to be heavier ~300 nm into the silicon, and much lighter at the silicon surface. It is also possible to dope channel regions with separate implants.

I claim:

1. A silicon on insulator (SOI) substrate process comprising the steps of:

etching a top surface of a single crystal silicon wafer everywhere, leaving silicon pedestals unetched;

wherein the pedestals are approximately the shape of and positioned to align to subsequent MOS transistor channel regions;

depositing silicon dioxide (oxide) to a thickness greater than the height of the pedestals;

chemically mechanically polishing the oxide to a height coplanar with the top of the silicon pedestals, exposing the pedestals top surface;

partially etching the oxide with openings to a depth less than the height of the pedestals;

wherein these openings correspond in position and shape to that of a subsequent MOS transistor, including channel, drain extensions and source extensions;

wherein what will be the channel portion of each opening is designed to be positioned over a pedestal;

depositing amorphous silicon to a thickness greater than the depth of the openings;

chemically mechanically polishing the amorphous silicon to a height coplanar with the top of the silicon pedestals, exposing the pedestals top surface.

2. The process of claim 1, wherein the pedestal heights are approximately 300 nm, and the depth of the oxide openings is approximately 100 nm.

3. The process of claim 1, wherein the top surface of the silicon pedestals is an etch stop for the chemical mechanical polishing of the oxide.

4. The process of claim 1, wherein a top surface of a thickest portion of the deposited oxide is an etch stop for chemical mechanical polishing of the amorphous silicon.

5. The process of claim 3, where the silicon pedestal top surface has a thin silicon nitride (nitride) coating formed before the oxide deposition, to act as an etch stop for chemical mechanical polishing;

wherein this nitride layer is removed after oxide polishing.

6. The process of claim 5, wherein the nitride is approximately 10 nm thick.

* * * * *